United States Patent
He et al.

(10) Patent No.: US 7,696,755 B2
(45) Date of Patent: Apr. 13, 2010

(54) MAGNETIC RESONANCE COIL COMPOSED OF RELATIVELY MOVABLE CONSTITUENT ELEMENTS

(75) Inventors: Zeng He He, ShenZhen (CN); Jian Min Wang, ShenZhen (CN); Yang Wang, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/262,741

(22) Filed: Oct. 31, 2008

(65) Prior Publication Data

US 2009/0115418 A1    May 7, 2009

(30) Foreign Application Priority Data

Oct. 31, 2007    (CN) .................. 2007 2 0195880 U

(51) Int. Cl.
*G01V 3/00*    (2006.01)
(52) U.S. Cl. ...................................... 324/318; 324/322
(58) Field of Classification Search ................. 324/318, 324/322
See application file for complete search history.

(56) References Cited

U.S. PATENT DOCUMENTS

| 4,897,604 | A | * | 1/1990 | Carlson et al. | 324/318 |
| 5,606,259 | A | * | 2/1997 | Potthast et al. | 324/318 |
| 6,137,291 | A | * | 10/2000 | Szumowski et al. | 324/318 |
| 6,438,402 | B1 | * | 8/2002 | Hashoian et al. | 600/410 |
| 7,365,542 | B1 | * | 4/2008 | Rohling et al. | 324/318 |

\* cited by examiner

*Primary Examiner*—Louis M Arana
(74) *Attorney, Agent, or Firm*—Schiff Hardin LLP

(57) ABSTRACT

A magnetic resonance coil has an antenna portion for accommodating a body part to be examined, the antenna portion is formed by a number of constituent units connected in series, the positions between various constituent units are relatively movable. By moving the positions between the constituent units, a portion of the area between at least two constituent units overlaps. By increasing or reducing the number of the constituent units, or by adjusting the overlapped area between the constituent units, one pair or a number of pairs of the constituent units are made to overlap completely, so as to achieve the adjustment of the size of the antenna portion to accommodate a body part to be examined, and to make said antenna portion as close as possible to the body part to be examined, so as to obtain a signal with a relatively high signal-to-noise ratio, and to obtain a relatively high imaging quality.

7 Claims, 1 Drawing Sheet

MAGNETIC RESONANCE COIL COMPOSED OF RELATIVELY MOVABLE CONSTITUENT ELEMENTS

BACKGROUND OF THE INVENTION

1. Field of the Invention

The present invention relates to an accessory of a magnetic resonance imaging system, in particular to a magnetic resonance coil.

2. Description of the Prior Art

A magnetic resonance coil is used to receive a magnetic resonance signal of a body part to be examined in a magnetic resonance imaging device; said magnetic resonance signal is conveyed to an image reconstruction system to perform image reconstruction. The quality of an image reconstruction, which affects the diagnosis result, is an important factor, and the signal-to-noise ratio of the magnetic resonance signal, which determines the quality of the image reconstruction, is an important parameter. Generally, the higher the signal-to-noise ratio, the better the quality of the image reconstruction; and the smaller the distance between the magnetic resonance coil and the body part to be examined, the higher the signal-to-noise ratio.

Referring to FIG. 1, in a typical magnetic resonance coil 10 in prior art, an antenna portion 12 is formed inside a dashed line frame, the antenna portion 12 being formed by inductors and capacitors connected in series, and usually is in an annular shape and used for accommodating the body part to be examined inside it. A shortcoming of the magnetic resonance coil 10 is that said antenna portion 12 is a unity, the size of which is fixed. Therefore, the antenna portion 12 of the magnetic resonance coil 10 may not be suitable for the examination of different body parts to be examined. For example, in the case of the examined patient being too fat, the size of a body part to be examined being too large, or the body part to be examined being covered by thick plaster, etc., the antenna portion 12 may be not used because it is not able to accommodate the body part. In the case of the examined patient being too thin, the examined patient being a baby or a child, or the size of the body part to be examined being too small, although the antenna portion 12 can accommodate the body part, the distance between said portion 12 and the body part to be examined is large. This leads to a relatively low signal-to-noise for the received magnetic resonance signal, seriously affecting the quality of the reconstruction image, and can even lead in extreme cases to misdiagnosis.

In order to solve the above problems, in existing magnetic resonance systems, a large number of such magnetic resonance coils 10 with various sizes have to be provided for different cases, such as patients of different sizes, different patient body parts to be examined, and the adaptation for different situations so as to be suitable for the same body part to be examined of both an adult and a child. This results in a great increase in cost, and not only will the replacement of a magnetic resonance coil for different cases greatly increase the workload of a doctor, but also the necessary plug-pull or on-off power of the magnetic resonance system due to the frequent replacement of the magnetic resonance coils may lead to a shortened operating life of the magnetic resonance system, or more seriously lead to physical damage to the magnetic resonance system.

Chinese patent application No. 200520004982.8 discloses a receiving coil combination structure that is formed by interconnecting at least a rigid sub-component and at least a flexible sub-component, so as to produce a complex shape for the receiving coil to meet the detection needs of different body parts of a patient. However, during the application of this receiving coil, it is still necessary to increase, reduce or replace said rigid sub-component or flexible sub-component according to different cases, but it is not possible to freely adjust the size of the antenna portion. Therefore, inevitably the magnetic resonance system will frequently be plugged in and unplugged and have the power switched on and of, thereby resulting in a shortened operating life of the magnetic resonance system, or more seriously resulting in physical damage to the magnetic resonance system.

SUMMARY OF THE INVENTION

An object of the invention is to present a magnetic resonance coil, said magnetic resonance coil comprising an antenna, the size of which can be adjusted freely and is suitable for the examination of body parts of different sizes.

The above object is achieved in accordance with the present invention by a magnetic resonance coil assembly having an antenna portion for accommodating a body part to be examined, the antenna portion being formed by a number of constituent units connected in series, the positions of adjacent constituent units being relatively movable, and by moving the positions of adjacent constituent units, respective portions of at least two adjacent constituent units is made to overlap.

In an embodiment of the invention, the overlapping areas between two adjacent constituent units are the same. The number of the constituent units of the antenna portion of the magnetic resonance coil is increased or reduced according to the size of the body part to be examined of a patient, so as to realize the adjustment of the size of the antenna portion to accommodate the body part to be examined, and the antenna portion is made to be as close as possible to the body part to be examined, so as to obtain a signal with a relatively high signal-to-noise ratio, and to obtain a relatively high imaging quality.

In another embodiment of the invention, at least one pair of the constituent units overlaps completely, while the overlapping areas between the rest of every pair of constituent units are the same. By adjusting the overlapping areas between the constituent units of the antenna portion, one pair or a number of pairs of the constituent units are made to overlap completely, or one pair which originally overlap completely or a number of pairs of the constituent units are made to recover the same overlapping areas with the ones between the other constituent units, such that the size of the antenna portion can be adjusted freely without changing the resonant frequency of the antenna portion, so as to accommodate the body part to be examined by increasing or reducing its size, and the antenna portion is made to be as close as possible to the body part to be examined, so as to obtain a signal with a relatively high signal-to-noise ratio, and to obtain a relatively high imaging quality.

DESCRIPTION OF THE PREFERRED EMBODIMENTS

Figure 1:
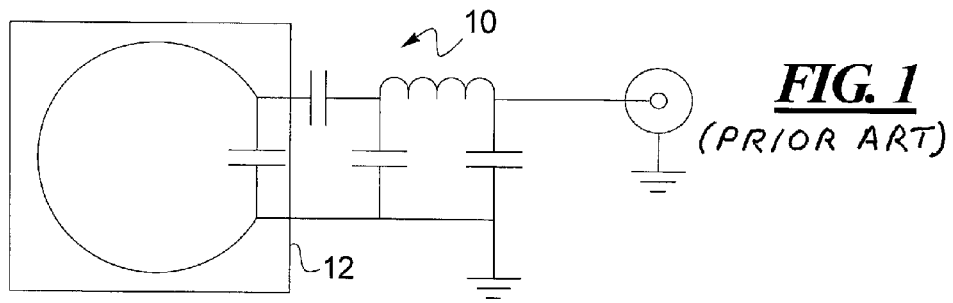
FIG. 1 is a basic schematic diagram of a known magnetic resonance coil.
Figure 2:
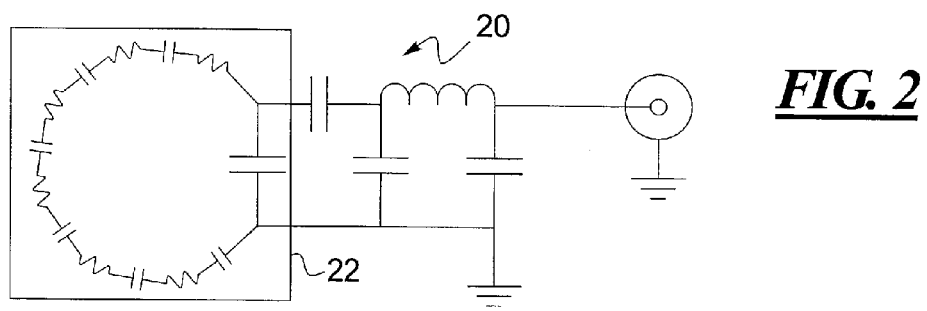
FIG. 2 is a basic schematic diagram of a magnetic resonance coil of the present invention.

Referring to FIG. 2, a magnetic resonance coil 20 of the invention has an antenna portion 22 inside a dashed line frame, wherein said antenna portion 22 is formed by a number of inductors and a number of capacitors connected in series, and usually is in an annular shape and is used for accommodating the body part to be examined. The difference between the magnetic resonance coil of the invention and a known magnetic resonance coil 10 shown in FIG. 1 is that the known antenna portion 12 of the magnetic resonance coil 10 is formed by inductors and capacitors connected in series as a whole, and the structure causes the antenna portion 12 of the known magnetic resonance coil 10 to be an integral structure with a fixed size. The antenna portion 22 of the magnetic resonance coil 20 of the invention is formed by a number of inductors and a number of capacitors connected in series, and the resonant frequency after the inductors and the capacitors are connected in series is the same as the resonant frequency of the antenna portion 12 of the magnetic resonance coil 10 in the prior art. The structure, with reference to FIG. 3, is that the antenna portion 22 of the magnetic resonance coil 20 is formed by a number of constituent units 220 (for brevity, only one of the constituent units 220 is labeled) connected in series, such that by adjusting mutual positions between constituent units 220, the size of the antenna portion 22 is adjusted, thereby adapting to body parts of different sizes which are to be examined.

Figure 3:
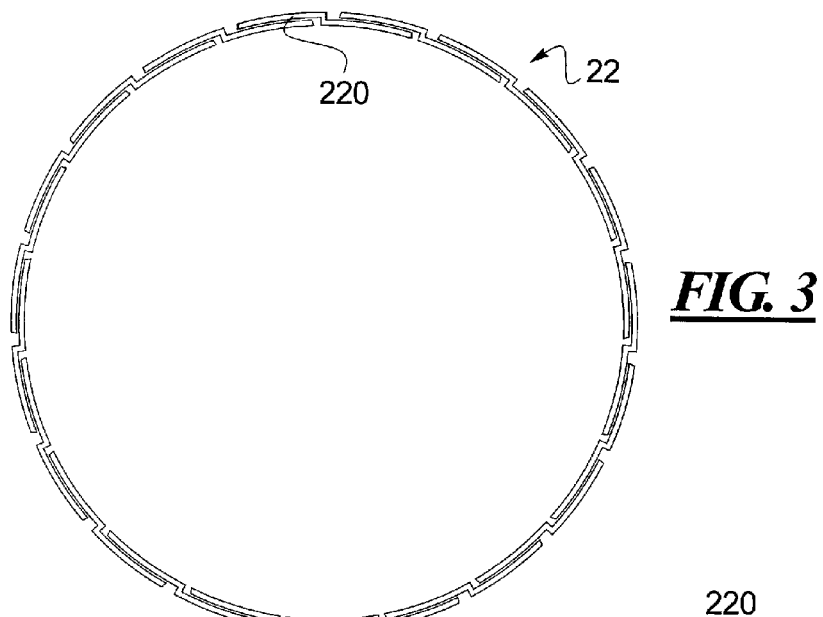
FIG. 3 is a structural schematic diagram of a preferred embodiment of the magnetic resonance coil of the invention, an antenna portion of the magnetic resonance coil being formed by a number of constituent units.
Figure 4:
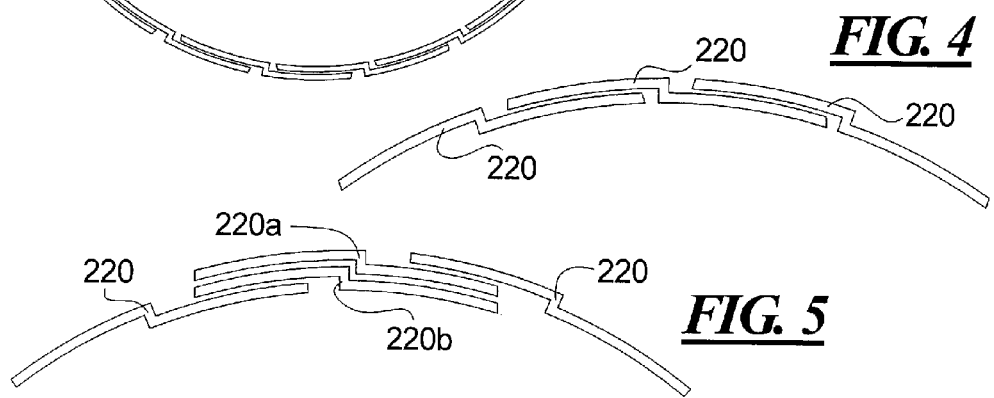
FIG. 4 is a schematic diagram of location relationship between constituent units in FIG. 3.

Referring simultaneously to FIG. 3 and FIG. 4, the antenna portion 22 of the magnetic resonance coil 20 of the invention is formed by a number of constituent units 220 connected in series. Each constituent unit 220 has a certain curvature, the annular antenna portion 22 is formed after constituent units are connected in series, and the positions between the constituent units 220 are relatively movable. Preferably, the surface of each constituent unit 220 is coated with a nonmagnetic and conductive metal medium. By moving the positions between the constituent units 220, the two constituent units 220 are made to overlap on a part area between them, and a capacitance is produced by the overlapped part, the size of the capacitance produced being decided by the size of the overlapped area; and an inductance is produced by the length of the constituent units, and the size of the inductance produced is decided by the length of the constituent units.

By adjusting the overlapping areas between said constituent units 220 to make each the overlapping area the same, thus all produced capacitance C are the same; by adjusting the length of the constituent units 220 to make the length of each constituent unit the same, thus all produced inductance L are the same also. The resonant frequency of each constituent unit is $1/\sqrt{LC}$. If the antenna portion 22 of the magnetic resonance coil 20 is formed by N constituent units 220, then the equivalent capacitance of the antenna portion formed by the N constituent units 220 connected in series is C/N, the equivalent inductance is NL, and the resonant frequency is $1/\sqrt{NL \cdot C/N} = 1/\sqrt{LC}$. It can be seen that the resonant frequency of the antenna portion 22 formed by N constituent units 220 connected in series is the same as the resonant frequency of the integral antenna portion in the prior art. Therefore, the number of constituent units 220 can be increased or reduced arbitrarily, and this will not affect the resonant frequency of the antenna portion 22.

Therefore, in an embodiment of the magnetic resonance coil 20 of the invention, the number of constituent units 220 of the antenna portion 22 of the magnetic resonance coil 20 can be increased or reduced according to the size of the body part to be examined, so as to realize the adjustment of the size of the antenna portion 22 to accommodate said body part to be examined, and the antenna portion 22 is made to be as close as possible to the body part to be examined, so as to obtain a signal with a relatively high signal-to-noise ratio, and to obtain a relatively high imaging quality.

Particularly, when two constituent units 220 overlap completely, the electromagnetic parameter thereof is equivalent completely to one constituent unit 220, thereby exerting no influence on the resonant frequency of said antenna portion 22, and only after two constituent units 220 overlap completely, will the length be reduced to half of the original length.

Figure 5:
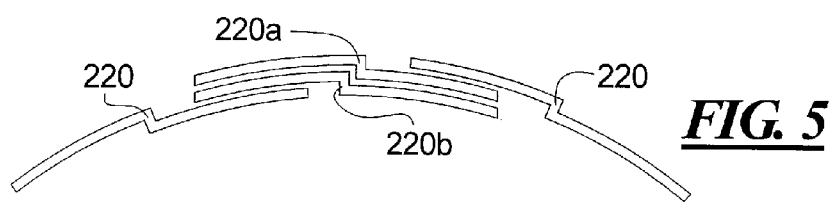
FIG. 5 is a schematic diagram of location relationship between constituent units of another preferred embodiment of the magnetic resonance coil according to the invention.

Therefore, referring to FIG. 5, in another embodiment of the magnetic resonance coil 20 of the invention, by adjusting the overlapping areas between constituent units 220 of the antenna portion 22, one pair or a number of pairs of the constituent units 220-a, 220-b are made to overlap completely, or one pair which originally overlaps completely or a number of pairs of the constituent units 220-a, 220-b are made to recover the same overlapping areas with the ones between the other constituent units 220, such that the size of the antenna portion can be adjusted freely without changing the resonant frequency of the antenna portion 22, to accommodate a body part to be examined by increasing or decreasing its size, the antenna portion 22 thus is made to be as close as possible to said body part to be examined, so as to obtain a signal with a relatively high signal-to-noise ratio, and to obtain a relatively high imaging quality.

The above two embodiments of the magnetic resonance coil of the invention can be implemented separately, or can be implemented in combination, such that the size of the antenna portion 22 of said magnetic resonance coil 20 can be adjusted more freely according to the size of the body part to be examined.

In the above embodiments of the magnetic resonance coil of the invention, the constituent units 220 of the antenna portion 22 of the magnetic resonance coil 20 are implemented in a stepped structure with a curvature. In other embodiments of the magnetic resonance coil of the invention, the constituent units 220 can be implemented in an arcuated structure or other equivalent shape structure.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance coil assembly, comprising:
   an antenna configured to accommodate a body part to be examined by magnetic resonance;
   said antenna comprising a plurality of constituent units connected with each other in electrical series with respective connections allowing relative movement between adjacent constituent units; and
   adjacent constituent units among said plurality of constituent units in electrical series being relatively movable so as to overlap at least a portion of the adjacent constituent units in electrical series to selectively adjust a size of said antenna.

2. A magnetic resonance coil assembly as claimed in claim 1 wherein said constituent units are configured to provide an identical amount of overlap between every two adjacent constituent units.

3. A magnetic resonance coil assembly as claimed in claim 1 wherein at least one pair of adjacent constituent units overlap each other completely by said relative movement, and wherein all other adjacent pairs of constituent units in said plurality of constituent units overlap each other by an identical, non-complete amount.

4. A magnetic resonance coil assembly as claimed in claim 1 wherein each of said constituent units has an arcuate structure.

5. A magnetic resonance coil assembly as claimed in claim 1 wherein each of said constituent units has a stepped structure with a curvature.

6. A magnetic resonance coil assembly as claimed in claim 1 wherein each of said constituent units has a surface coated with a non-magnetic, conducted metal.

7. A magnetic resonance coil assembly as claimed in claim 1 wherein said constituent units are configured to give said antenna an annular shape.

\* \* \* \* \*